United States Patent [19]

Suzuki

[11] Patent Number: 5,362,976
[45] Date of Patent: Nov. 8, 1994

[54] HIGH FREQUENCY SEMICONDUCTOR DEVICE HAVING OPTICAL GUIDE PACKAGE STRUCTURE

[75] Inventor: Katsuhiko Suzuki, Tokyo, Japan

[73] Assignee: NEC Corporation, Tokyo, Japan

[21] Appl. No.: 966,346

[22] Filed: Oct. 26, 1992

[30] Foreign Application Priority Data

Oct. 26, 1991 [JP] Japan .................. 3-306540

[51] Int. Cl.5 ............................................ H01L 23/02
[52] U.S. Cl. ................................. 257/81; 257/82; 257/432
[58] Field of Search ............... 257/80, 81, 82, 98, 257/432

[56] References Cited

U.S. PATENT DOCUMENTS

| | | | |
|---|---|---|---|
| 4,695,120 | 9/1987 | Holder | 257/82 |
| 4,862,231 | 8/1989 | Abend | 257/81 |
| 4,879,250 | 11/1989 | Chan | 257/80 |
| 5,093,879 | 3/1992 | Bregman et al. | 257/80 |
| 5,198,684 | 3/1993 | Sudo | 257/81 |

FOREIGN PATENT DOCUMENTS

| | | | |
|---|---|---|---|
| 0090968 | 5/1984 | Japan | 257/81 |
| 0225485 | 11/1985 | Japan | 257/81 |

*Primary Examiner*—Rolf Hille
*Assistant Examiner*—David Ostrowski
*Attorney, Agent, or Firm*—Sughrue, Mion, Zinn, Macpeak & Seas

[57] ABSTRACT

A semiconductor device chip includes a plurality of light emitting diodes for converting into a photo output signal an electric signal to be outputted from the semiconductor device chip, and a plurality of photodiodes for converting a photo input signal into an electric signal. A circuit substrate supporting the semiconductor device chip includes optical guide each located to output a photo signal to a corresponding photodiode or to receive a photo signal emitted from a corresponding light emitting diode. Thus, input/output signals are transmitted in the form of a photo signal through the optical guide at the outside of the semiconductor device chip. Therefore, an electrostatic capacitance between adjacent lead conductors formed on the package can be decreased, and also, an insolation between adjacent lead conductors and a gain can be improved.

5 Claims, 2 Drawing Sheets

HIGH FREQUENCY SEMICONDUCTOR DEVICE HAVING OPTICAL GUIDE PACKAGE STRUCTURE

BACKGROUND OF THE INVENTION

1. Field of the Invention

The present invention relates to a high frequency semiconductor device having an improved package structure.

2. Description of Related Art

In the prior art, a typical one of package structures for a semiconductor device has been constituted of a first level square ceramic substrate having a die attaching area formed by printing a tungsten paste on a central portion of the substrate. A second level ceramic substrate in the form of a square ring is laminated on an upper surface of the first level ceramic substrate in such a manner in that the die attaching area is exposed and surrounded by the second level square ring substrate. In addition, a number of radial-patterned conductors composed of a tungsten paste are printed on an upper surface of the second level square ring substrate. A third level ceramic substrate in the form of a square ring, which has an inner size larger than that of the second level square ring substrate but an outer size smaller than that of the second level square ring substrate, is laminated on the second level square ring substrate for the purpose of insulating and protecting the radial conductors, in such a manner that respective inner tip ends of the radial conductors positioned in a periphery of the die attaching area are exposed. In addition, a seal frame for supporting a cap is mounted on the third level square ring substrate, and patterned side metallized conductors are provided on a side surface of the laminated substrates.

Thereafter, the substrates thus prepared are sintered in an oxidizing atmosphere of 1500° C. to 1600° C., so that the tungsten paste reacts with the ceramic so as to be metallized. The metallized conductors are plated with Ni and Au, respectively. Thus, a semiconductor device package is completed.

On the die attaching area of the package thus formed, a semiconductor device chip is bonded by use of an Au—Si solder, and pads of the die-bonded chip are connected to corresponding radial-patterned conductors by means of aluminum wires. In addition, external lead wires are connected to corresponding patterned side metallized conductors, respectively.

In the above mentioned package structure, the substrates constituting the package and other materials has a large dielectric constant, and a spacing between adjacent metallized patterned conductors is narrow. Therefore, an electrostatic capacitance between adjacent lead conductors is large, and isolation between the lead conductors and gain is not satisfactory. In addition, a resonance frequency of the semiconductor device is low. As a result, the above mentioned package structure has been difficult to use as a high frequency semiconductor device package.

SUMMARY OF THE INVENTION

Accordingly, it is an object of the present invention to provide a semiconductor device which has overcome the above mentioned defect of the conventional one.

Another object of the present invention is to provide a semiconductor device having an improved package, which has a reduced electrostatic capacitance between adjacent lead conductors, an improved isolation between the lead conductors, and an increased gain.

The above and other objects of the present invention are achieved in accordance with the present invention by a semiconductor device comprising a circuit substrate and a semiconductor device chip supported on the circuit substrate, the semiconductor device chip having at least one light emitting diode for convening into a photo output signal an electric signal to be outputted from the semiconductor device chip, the semiconductor device chip also having at least one photodiode for converting a photo input signal into an electric signal, the circuit substrate having a first lead optical guide mounted thereon and positioned to have its inner end opposed to the at least one light emitting diode so as to guide the photo output signal emitted from the at least one light emitting diode, to an outer end of the first lead optical guide, the circuit substrate also having a second lead optical guide mounted thereon and positioned to have its inner end opposed to the at least one photo diode so as to guide to the at least one photo diode the photo output signal inputted to an outer end of the second lead optical guide.

In one embodiment, a planar microlens is interposed between the semiconductor device chip and the circuit substrate in such a manner that lenses formed in the planar microlens are positioned between the light emitting diode and the first lead optical guide and between the photo diode and the second lead optical guide.

With the above mentioned arrangement, the input signal and the output signal of the semiconductor device chip are a photo signal which is supplied to the photodiode or emitted from the light emitting diode and which is guided through the lead optical guide. Therefore, the problem of the electrostatic capacitance and the isolation between the lead conductors in the package disappears. As a result, the isolation between the lead conductors and the gain will be remarkably improved.

The above and other objects, features and advantages of the present invention will be apparent from the following description of preferred embodiments of the invention with reference to the accompanying drawings.

DESCRIPTION OF THE PREFERRED EMBODIMENTS

Figure 1:
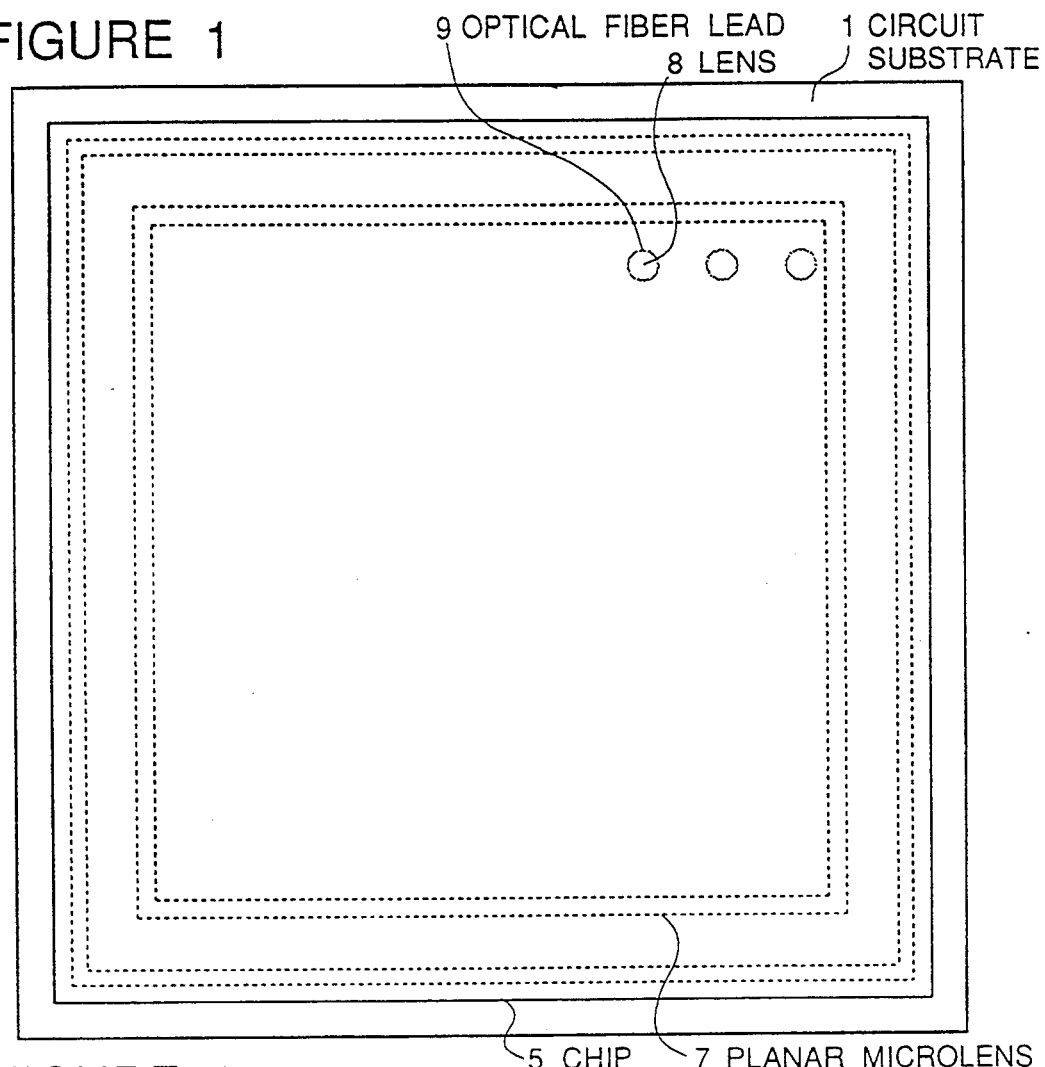
FIG. 1 is a diagrammatic plan view of a first embodiment of the semiconductor device in accordance with the present invention.
Figure 2:
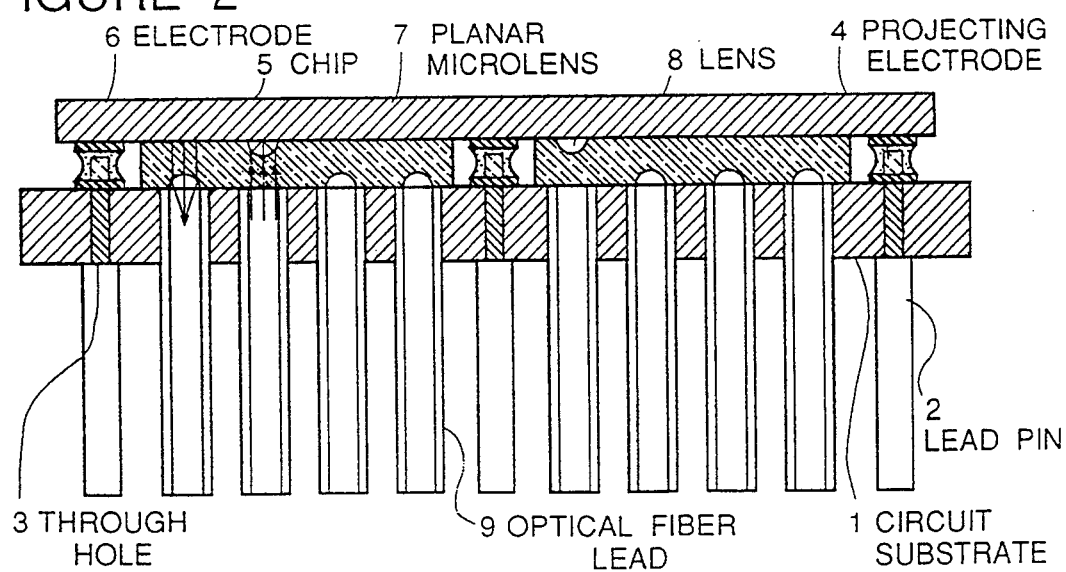
FIG. 2 is a diagrammatic sectional view of the first embodiment of the semiconductor device in accordance with the present invention.
Figure 3:
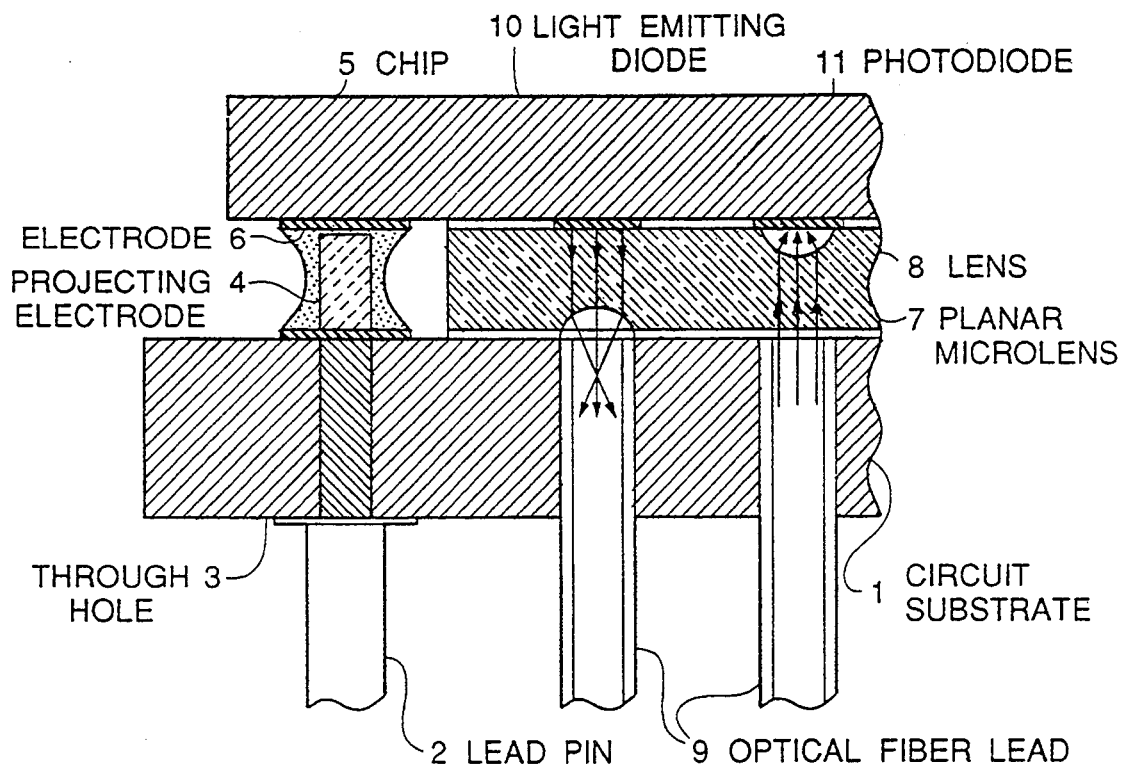
FIG. 3 is a diagrammatic partial enlarged sectional view of the first embodiment of the semiconductor device in accordance with the present invention.

Referring to FIGS. 1 to 3, a first embodiment of the, semiconductor device in accordance with the present invention includes a circuit substrate 1 formed of, for example, a ceramic glass, a plastics, a glass-plastics composite material, or a metal sheet treated to be used as an insulator. This circuit substrate 1 has a plurality of lead pins 2 which are fixed perpendicular to the circuit substrate 1 at a plurality of different positions of a lower surface of the circuit substrate 1. These lead pins 2 can be used as a voltage supply pin or a ground pin. Each of the lead pins 2 is connected, through a corresponding through-hole 3 which is formed to pierce through the circuit substrate 1 and is filled with an electrically conductive material, to a corresponding projecting electrode 4 formed on an upper surface of the circuit substrate 1.

On the upper surface of the circuit substrate 1, a planar microlens 7 is located, and a semiconductor device chip 5 is located on the planar microlens 7 in such a manner that a-peripheral region of the semiconductor device chip 5 extends outwardly beyond an outer peripheral edge of the planar microlens 7. Each of electrodes 6 located on a lower surface of the chip 5 is connected to a corresponding projecting electrode 4 of the circuit substrate 1.

The planar microlens 7 is constituted of a glass plate of about 1 mm thickness which has parallel upper and lower planar surfaces and which includes therein a number of lenses 8 formed and distributed in the inside of the upper and lower planer surfaces of the glass plate. Each of the lenses is formed of a hemispheric refractive index distributed region. In FIGS. 1 and 3, the lenses 8 formed at the opposite planar surfaces of the glass plate are depicted as being gouged in the form of a hemisphere. This shows a different refractive index portion.

The circuit substrate 1 includes a plurality of through-holes which are formed at positions corresponding to the respective lenses 8 of the planar microlens 7 and in each of which a lead optical fiber 9 is inserted and held. On the other hands, a plurality of light emitting diodes 10 and a plurality of photodiodes 11 are located at the lower surface of the semiconductor device chip 5 to oppose to corresponding lenses 8. In FIG. 3, only one light emitting diode 10 and only one photodiode 11 are shown for simplification of the drawing.

Finally, the semiconductor device 5 is encapsulated by cooperation of the circuit substrate 7 and a cap (not shown) fitted over the circuit substrate 7.

With the above mentioned arrangement, signals to be outputted from the semiconductor device chip 5 are converted into corresponding photo signals by the associated light emitting diodes 10, and the photo signals are focused to the end of the corresponding lead optical fibers 9 by the associated lenses 8, so that the photo signals are guided through the lead optical fibers 9 to an external. On the other hand, signals to be supplied from the external to the semiconductor device chip 5 are guided through the lead optical fibers 9 and focused onto the corresponding photodiodes 11 by the associated lenses 8, and converted into electric signals which are supplied into the inside of the semiconductor device chip 5.

Namely, all external signals to be supplied to the semiconductor device chip and to be outputted from the semiconductor device chip are in the form of a photo signal, even if only the voltage supply voltage and the ground level are supplied to the semiconductor device chip in the form of an electric voltage. Therefore, it is possible to couple a long optical fiber to each of the lead optical fibers 9 for the purpose of a signal transmission. On the other hand, a signal processing performed within the semiconductor device chip is executed in the form of an electrical signal. Accordingly, because of photoelectric converting circuits provided at an interface with an external circuit, electric signals can be treated similarly to the conventional semiconductor devices.

In the shown semiconductor device, therefore, even if a spacing between adjacent lead conductors are made narrow, an electrostatic capacitance between the adjacent lead conductors is suppressed, and therefore, an isolation between the adjacent lead conductors and a gain can be improved. Accordingly, the resonance frequency can be increased.

Figure 4:
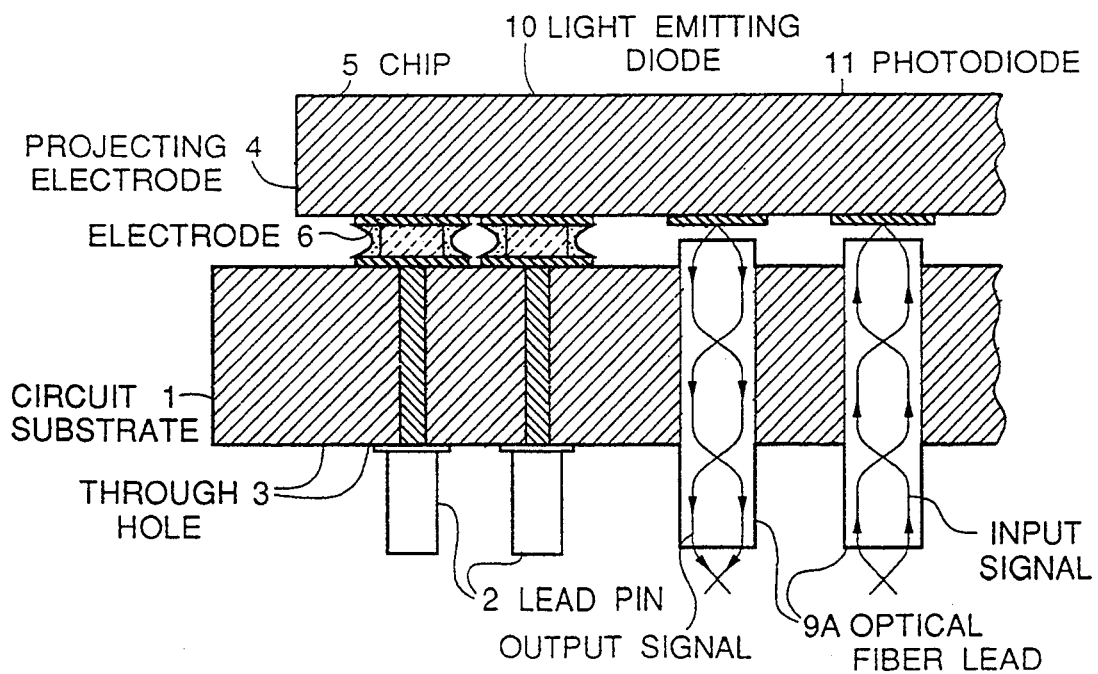
FIG. 4 is a view similar to FIG. 3 but showing a second embodiment of the semiconductor device in accordance with the present invention.

Referring to FIG. 4, there is shown a second embodiment of the semiconductor device in accordance with the present invention. In FIG. 4, elements or parts similarly or corresponding to those shown in FIG. 3 are given the same Reference Numerals.

In the second embodiment shown in FIG. 4, a pair of lead pins 2 for the voltage supply voltage and the ground are located in parallel and adjacent to each other, and connected to projecting electrodes 4, respectively, which are also connected to corresponding voltage supply and ground electrodes 6 of the semiconductor device chip 5. No planar microlens 7 is provided, but the semiconductor device chip 5 is located on the circuit substrate 1 with a small gap being maintained between the semiconductor device chip 5 and the circuit substrate 1. The semiconductor chip 5 includes a plurality of light emitting diodes 10 and a plurality of photodiodes 11 located at the lower surface thereof. A corresponding number of through-holes are formed to pierce through the circuit substrate 1, and inserted with lead optical guides 9A formed of a quartz glass rod in such a manner that an inner end of the lead optical guides 9A oppose the light emitting diodes 10 and the photodiodes 11, respectively. This quartz glass rod used as the lead optical guides 9A is constituted of a circular column of optical glass in which the refractive index changes in a radial direction from its center axis to a peripheral surface.

Also in this second embodiment, signals to be outputted from the semiconductor device chip 5 are converted into corresponding photo signals by the associated light emitting diodes 10, and the photo signals are focused to the end of the corresponding lead optical guides 9A in which the the photo signals are guided through the lead optical guides 9A with repeated refractions within the lead optical guide 9A and outputted to an external. On the other hand, signals to be supplied from the external to the semiconductor device chip 5 are guided through the lead optical guides 9A and outputted onto the corresponding photodiodes 11, and converted into electric signals which are supplied into the inside of the semiconductor device chip 5.

Also in the second embodiment, therefore, even if a spacing between adjacent lead conductors are made narrow, an isolation between the adjacent lead conductors and a gain can be improved, and therefore, the resonance frequency can be increased.

As will be apparent from the above mentioned description with reference to the drawings, the semiconductor device in accordance with the present invention is characterized in that the semiconductor device chip includes a plurality of light emitting diodes for convening into a photo output signal an electric signal to be outputted from the semiconductor device chip, and a plurality of photodiodes 11 for converting a photo input signal into an electric signal, and the circuit substrate supporting the semiconductor device chip includes optical guide means each located to output a photo signal to a corresponding photodiode or to receive a photo signal emitted from a corresponding light emitting diode, so that the input/output signals are transmitted in the form of a photo signal through the optical guide means at the outside of the semiconductor device chip. Therefore, it becomes free from a decreased operation speed due to an electrostatic capacitance attributable to package material and size, electric resistance and inductance of the metallized patterned conductors, an insolation, a gain, a decreased resonance frequency, etc. Therefore, it becomes possible to construct a high frequency semiconductor device, and in addition, it is also possible to increase the degree of freedom in designing the package and the circuit board.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device comprising a circuit substrate and a semiconductor device chip supported on said circuit substrate, said semiconductor device chip being configured to treat all internal signals in the form of an electric signal, said semiconductor device chip having at least one voltage supply electrode and at least one ground electrode, a plurality of light emitting means each for converting into a photo output signal an electric signal to be outputted from said semiconductor device chip, said semiconductor device chip also having a plurality of photo detecting means each for converting a photo input signal into an electric signal, said at least one voltage supply electrode, said at least one ground electrode, said light emitting means and said photo detecting means being located on a first surface of said semiconductor device chip; and said circuit substrate having a first surface and including at least one voltage supply pin and at least one ground pin formed to project upright from said first surface of said circuit substrate, said at least one voltage supply pin and said at least one ground pin being connected to said one voltage supply electrode and said one ground electrode of said semiconductor device chip, respectively, so that said semiconductor chip is fixed to said circuit substrate, said circuit substrate also having a plurality of first optical guide means mounted thereon, each having its inner end located at said first surface of said circuit substrate in a position relative to a corresponding one of said light emitting means so as to guide the photo output signal emitted from said corresponding light emitting means, to an outer end of said first optical guide means, said circuit substrate also having a second optical guide means mounted thereon and each having its inner end located at said first surface of said circuit substrate in a position relative to said photo detecting means so as to guide to said photo detecting means the photo output signal inputted to an outer end of said second optical guide means.

2. A semiconductor device claimed in claim 1 wherein a planar microlens is interposed between said semiconductor device chip and said circuit substrate in contact with said first surface of said semiconductor device chip and in contact with said first surface of said circuit substrate, in such a manner that each one of said light emitting means and the corresponding first optical guide means are optically coupled by a corresponding lens formed in said planar microlens, and each one of said photo detecting means and the corresponding second optical guide means are optically coupled by a corresponding lens formed in said planar microlens.

3. A semiconductor device claimed in claim 1 wherein each of said first optical guide means projects from said first surface of said circuit substrate towards said corresponding one of said light emitting means so that each one of said light emitting means and the corresponding first optical guide means are effectively optically coupled, and each one of said photo detecting means and the corresponding second optical guide means are effectively optically coupled.

4. A semiconductor device claimed in claim 3 wherein each of said first and second optical guide means is a circular column of optical glass in which the refractive index changes in a radial direction from its center axis to a peripheral surface.

5. A semiconductor device comprising a circuit substrate having a first surface, a semiconductor device chip having a first surface, and a planar microlens interposed between said semiconductor device chip and said circuit substrate, said planar microlens having a first surface in direct contact with said first surface of said semiconductor device chip and a second surface in direct contact with said first surface of said circuit substrate, said semiconductor device chip being configured to treat all internal signals in the form of an electric signal, said semiconductor device chip having at least one voltage supply electrode and at least one ground electrode, a plurality of light emitting means each for converting into a photo output signal an electric signal to be outputted from said semiconductor device chip, said semiconductor device chip also having a plurality of photo detecting means each for converting a photo input signal into an electric signal, said at least one voltage supply electrode, said at least one ground electrode, said light emitting means and said photo detecting means being located on said first surface of said semiconductor device chip; and said circuit substrate including at least one voltage supply pin and at least one ground pin located at the outside of said planar microlens and formed to penetrate through said circuit substrate and project upright from said first surface of said circuit substrate, said at least one voltage supply pin and said at least one ground pin being soldered and connected to said one voltage supply electrode and said one ground electrode of said semiconductor device chip, respectively, without passing in and through said planar microlens, so that said semiconductor chip is fixed to said circuit substrate, said circuit substrate also having a plurality of first optical guide means mounted to penetrate through said circuit substrate and each having its inner end positioned at said first surface of said circuit substrate in alignment to a corresponding one of said light emitting means through a corresponding one of lenses formed in said planar microlens so as to guide the photo output signal emitted from said corresponding light emitting means, to an outer end of said first optical guide means, said circuit substrate also having a second optical guide means mounted to penetrate through said circuit substrate and each having its inner end positioned at said first surface of said circuit substrate in alignment to said photo detecting means through a corresponding one of lenses formed in said planar microlens so as to guide to said photo detecting means the photo output signal inputted to an outer end of said second optical guide means.

* * * * *